United States Patent [19]

Chang

[11] Patent Number: 5,801,097
[45] Date of Patent: Sep. 1, 1998

[54] THERMAL ANNEALING METHOD EMPLOYING ACTIVATED NITROGEN FOR FORMING NITRIDE LAYERS

[75] Inventor: Tony Liang-Tung Chang, Hsinchu, Taiwan

[73] Assignee: Vanguard International Semiconductor Corporation, Hsin-Chu, Taiwan

[21] Appl. No.: 814,133

[22] Filed: Mar. 10, 1997

[51] Int. Cl.⁶ .................... H01L 21/4763; H01L 21/44
[52] U.S. Cl. .................... 438/643; 438/653; 438/655; 438/680; 438/685
[58] Field of Search ........................ 438/643, 653, 438/685, 655, 680

[56] References Cited

U.S. PATENT DOCUMENTS

| | | | |
|---|---|---|---|
| 4,621,277 | 11/1986 | Ito et al. | 357/54 |
| 5,043,300 | 8/1991 | Nulman | 437/200 |
| 5,093,710 | 3/1992 | Higuchi | 357/71 |
| 5,188,979 | 2/1993 | Filipiak | 437/192 |
| 5,254,499 | 10/1993 | Sandhu et al. | 437/192 |
| 5,286,676 | 2/1994 | Kruger et al. | 437/190 |
| 5,416,045 | 5/1995 | Kauffman et al. | 437/174 |
| 5,444,026 | 8/1995 | Kim et al. | 437/240 |
| 5,446,824 | 8/1995 | Moslehi | 392/416 |
| 5,545,592 | 8/1996 | Iacoponi | 437/200 |
| 5,593,511 | 1/1997 | Foster et al. | 148/238 |

OTHER PUBLICATIONS

"Advanced Inorganic Chemistry—A Comprehensive Test" by Cotton and Wilkinson, *Interscience Publishers*, New York, NY, 1972, p. 346.

*Primary Examiner*—Brian Dutton
*Attorney, Agent, or Firm*—George O. Saile; Stephen B. Ackerman; Alek P. Szecsy

[57] ABSTRACT

A thermal annealing method for forming a nitride layer within an integrated circuit. There is first provided a substrate. There is then formed over the substrate a nitride forming material layer. The nitride forming material layer is then annealed through a thermal annealing method in the presence of an atmosphere of activated nitrogen to yield a nitride layer. The method is particularly useful for forming titanium nitride barrier layers and titanium nitride adhesion promoter layers within integrated circuits.

13 Claims, 4 Drawing Sheets

THERMAL ANNEALING METHOD EMPLOYING ACTIVATED NITROGEN FOR FORMING NITRIDE LAYERS

BACKGROUND OF THE INVENTION

1. Field of the Invention

The present invention relates generally to thermal annealing methods for forming nitride layers within integrated circuits. More particularly, the present invention relates to a thermal annealing method employing activated nitrogen for forming nitride layers within integrated circuits.

2. Description of the Related Art

Generally known in the art of integrated circuit fabrication is the use of nitride layers, in particular, titanium nitride layers. Titanium nitride layers within integrated circuit fabrication are most commonly employed as adhesion promoter layers and/or barrier layers within integrated circuits. When employed as adhesion promoter layers, titanium nitride layers within integrated circuits are typically formed as liner layers beneath blanket tungsten layers from which in turn are formed conductive contact and interconnection studs through patterned dielectric layers within those integrated circuits. Alternatively, when employed as barrier layers within integrated circuits, titanium nitride layers are typically formed interposed between an aluminum containing conductor metallization layer and a doped silicon layer or a doped silicon semiconductor substrate. When formed in this location, a titanium nitride layer provides a barrier to inhomogeneous interdiffusion and spiking from the aluminum containing conductor metallization layer into the doped silicon layer or the doped silicon semiconductor substrate.

As integrated circuit technology has advanced and integrated circuit device dimensions have decreased, it has become increasingly important to form within advanced integrated circuits uniform and dense nitride layers, such as titanium nitride layers, in order to provide optimal adhesion promotion characteristics and barrier characteristics to those nitride layers. Of the several conventional methods for forming nitride layers, such as titanium nitride layers, within integrated circuits, a rapid thermal annealing (RTA) method through which a metal nitride forming metal layer is formed over a semiconductor substrate and annealed in the presence of nitrogen at elevated temperature to form a metal nitride layer is a particularly common and straightforward method. Under the circumstance where the metal nitride forming metal is also a metal silicide forming metal, such as titanium metal, and the metal nitride forming metal is formed directly upon the surface of the semiconductor substrate, the rapid thermal annealing (RTA) method may under certain process conditions also yield in addition to the metal nitride layer a metal silicide layer formed simultaneously separating the metal nitride layer from the semiconductor substrate. Such a metal silicide/metal nitride composite layer is desirable since it provides in addition to the adhesion promoter layer characteristics and barrier layer characteristics of the metal nitride layer a low contact resistance layer characteristic of the metal silicide layer. See, for example, Nulman, in U.S. Pat. No. 5,043,300, which discloses a multi-temperature single step rapid thermal annealing (RTA) method for forming from a titanium layer within a nitrogen ambient atmosphere a titanium silicide layer beneath a titanium nitride layer upon a semiconductor substrate.

While the rapid thermal annealing (RTA) method as disclosed by Nulman may be employed to form a titanium nitride layer upon a semiconductor substrate within an integrated circuit, it is also acknowledged by Nulman that the titanium nitride layer so formed is not easily formed. In particular, it is noted by Nulman that when forming the titanium nitride layer from the titanium layer the presence of oxygen must at all times be excluded from the titanium layer (col. 6, lines 7-28; col. 7, lines 4-16), thus necessitating for the invention as disclosed by Nulman a more cumbersome method and/or apparatus through which oxygen containing ambient atmosphere is excluded from the titanium layer. In order to form high density nitride layers, including but not limited to titanium nitride layers, through a rapid thermal annealing (RTA) method employing a metal nitride forming metal without the necessity of totally excluding oxygen, there has subsequently been disclosed by Filipiak in U.S. Pat. No. 5,188,979 the use of pre-heated ammonia as a nitrogen source material rather than nitrogen.

While the Filipiak disclosure indicates that highly effective titanium nitride barrier layers may be formed employing pre-heated ammonia within a rapid thermal annealing (RTA) method, it is nonetheless desirable to provide alternative rapid thermal annealing (RTA) methods through which metal nitride layers, such as titanium nitride layers, may be formed within integrated circuits without employing the hazardous gas ammonia as required by Filipiak. It is thus in part towards that goal that the present invention is directed.

There has also been disclosed in the art chemical vapor deposition (CVD) methods through which titanium nitride layers may be formed within integrated circuits. For example, Sandhu et al., in U.S. Pat. No. 5,254,499 discloses a chemical vapor deposition (CVD) method employing a tetrakis-dialkylamido titanium source material for forming titanium nitride layers within integrated circuits. In addition, Kauffman et al., in U.S. Pat. No. 5,416,045 discloses an analogous chemical vapor deposition (CVD) method employing a titanium tetrachloride source material for forming titanium nitride layers within integrated circuits. While there may in general be formed through chemical vapor deposition (CVD) methods within integrated circuits titanium nitride layers with desirable properties, neither Sandhu et al. nor Kauffman et al. address the oxygen exclusion problem to which the present invention is directed.

Further, there is also disclosed by Moslehi in U.S. Pat. No. 5,446,824 a lamp heated chuck for uniform semiconductor substrate wafer processing. Similarly, the apparatus as disclosed by Moslehi similarly does not address the oxygen exclusion problem to which the present invention is directed.

SUMMARY OF THE INVENTION

A first object of the present invention is to provide a thermal annealing method for forming within an integrated circuit a nitride layer, such as a titanium nitride layer, from a nitride forming material without need for excluding oxygen at all times when forming the nitride layer.

A second object of the present invention is to provide a thermal annealing method for forming within an integrated circuit a nitride layer, such as a titanium nitride layer, from a nitride forming material without employing ammonia as a nitrogen source material.

A third object of the present invention is to provide a method in accord with the first object of the present invention and the second object of the present invention, which method is readily manufacturable.

In accord with the objects of the present invention, there is provided by the present invention a thermal annealing method for forming within an integrated circuit a nitride layer from a nitride forming material layer. To practice the method of the present invention, there is first provided a substrate. There is then formed over the substrate a nitride forming material layer. The nitride forming material layer is then exposed to an atmosphere of activated nitrogen. Finally, the nitride forming material layer is annealed through a thermal annealing method in the presence of the atmosphere of activated nitrogen to yield a nitride layer.

The present invention provides a thermal annealing method for forming within an integrated circuit a nitride layer, such as a titanium nitride layer, from a nitride forming material layer without employing ammonia and without the need for excluding oxygen at all times when forming the nitride layer. The method of the present invention achieves these goals by employing a highly reactive form of activated nitrogen as a nitrogen source material, rather than ammonia as a nitrogen source material. Similarly to pre-heated ammonia, activated nitrogen is sufficiently reactive to form a nitride layer from a nitride forming material layer, such as a titanium metal layer, without the need for excluding oxygen at all times when forming the nitride layer.

The method of the present invention is readily manufacturable. As disclosed within the preferred embodiment of the method of the present invention, atmospheres of activated nitrogen may be formed through several means which are accessible within the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a thermal annealing method for forming within an integrated circuit a nitride layer, such as but not limited to a titanium nitride layer, from a nitride forming material layer without employing ammonia and without the need for excluding oxygen at all times when forming the nitride layer. The present invention achieves these goals by exposing a nitride forming material layer formed upon a substrate to an atmosphere of activated nitrogen. The nitride forming material layer within the atmosphere of activated nitrogen is annealed through a thermal annealing method, thus yielding a nitride layer, such as but not limited to a titanium nitride layer, upon the substrate.

The method of the present invention may be employed in forming nitride layers as layers within integrated circuits including but not limited to barrier layers and adhesion promoter layers within integrated circuits. In addition, the method of the present invention my be employed in forming nitride layers within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

Although the preferred embodiment of the method of the present invention discloses the method of the present invention employed in forming a titanium nitride layer as a barrier layer within an integrated circuit, as is understood by a person skilled in the art the method of the present invention may also be employed in forming several other nitride layers from nitride forming material layers located within the several locations and types of integrated circuits as noted above. In that regard, the method of the present invention may be employed in forming nitride layers within integrated circuits from nitride forming material layers including but not limited to titanium, aluminum, silicon, hafnium, zirconium, vanadium, niobium and tantalum layers. Preferably, the nitride forming material layer from which is formed the nitride layer through the method of the present invention is from about 10 to about 2000 angstroms thick.

Figure 1:
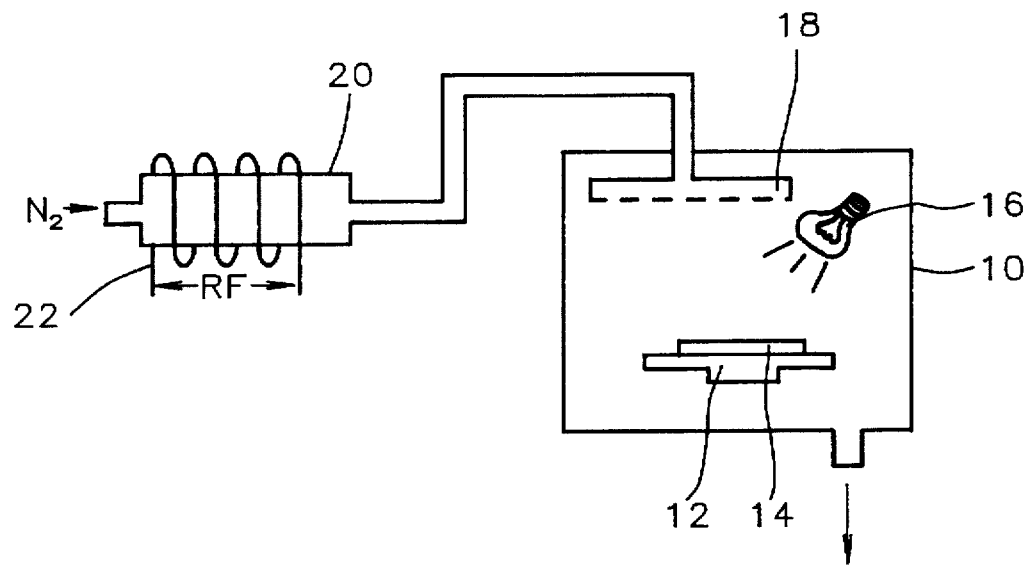
FIG. 1 to FIG. 3 show a series of schematic cross-sectional diagrams illustrating three embodiments of an apparatus through which may be performed the method of the present invention.
Figure 2:
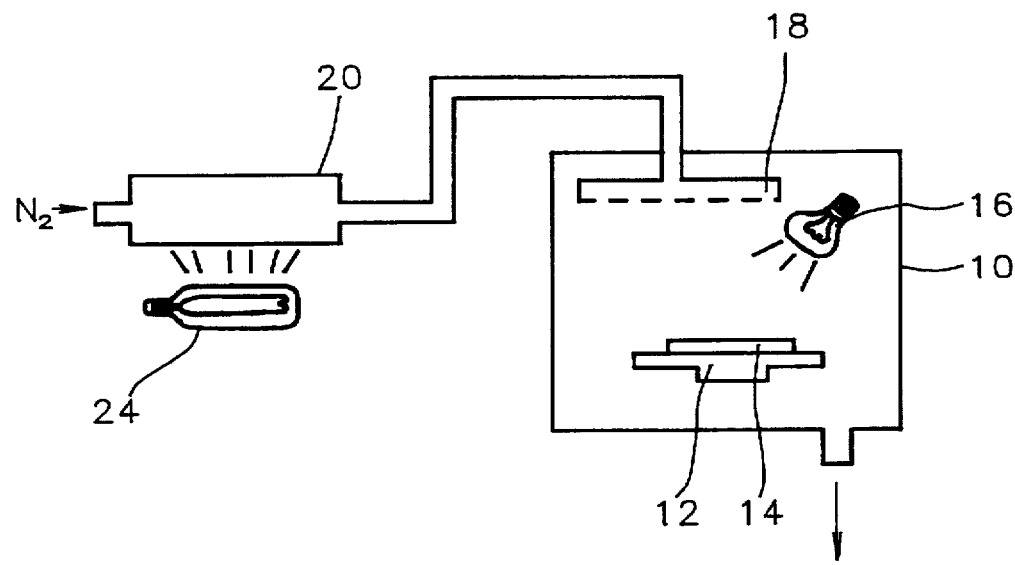
Figure 3:
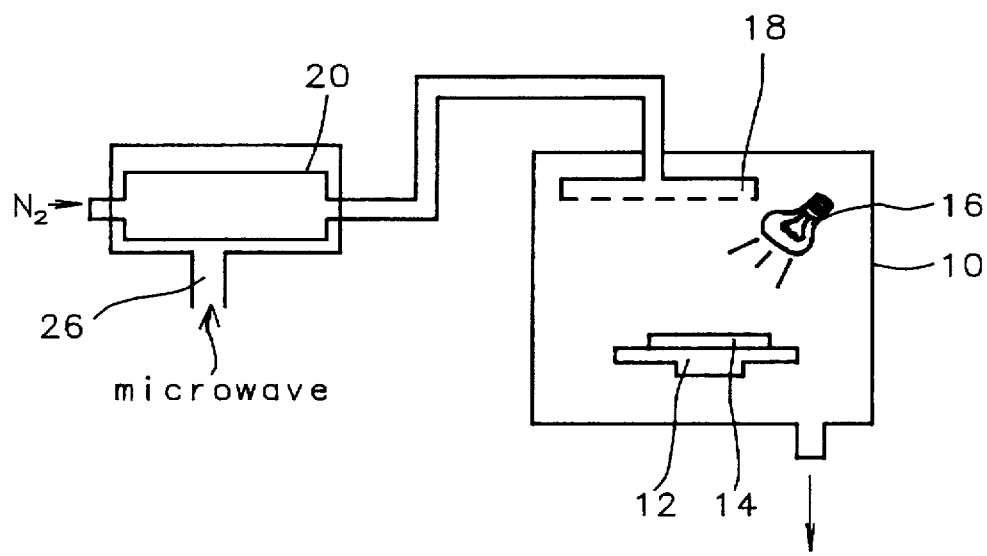

Referring now to FIG. 1 to FIG. 3, there is shown a series of cross-sectional schematic diagrams illustrating three embodiments of an apparatus through which may be practiced the method of the present invention. Shown in each of FIG. 1 to FIG. 3 is a reactor chamber 10 containing therein a platen 12 upon which is placed a substrate 14. The substrate has formed thereupon a nitride forming material layer which is desired to be processed through the thermal annealing method of the present invention, without employing ammonia and without excluding oxygen at all times from the presence of the nitride forming material layer, to form a nitride layer. Also contained within the reactor chamber 10 is a heat lamp 16 which is employed in the thermal annealing method for heating the substrate 14. For the preferred embodiment of the method of the present invention, the heat lamp 16, or another equivalent equivalent heat source, is preferably capable of providing a temperature of the substrate 14 of no less than about 900 degrees centigrade, as it is preferred to employ when forming nitride layers through the method of the present invention a thermal annealing temperature no less than about 900 degrees centigrade. Each reactor chamber 10 also has a nozzle 18 disposed therein sized to allow a nitrogen flow through the reactor chamber 10 preferably about 1000 to about 50000 standard cubic centimeters per minute (sccm). There is also shown communicating with the nozzle 18 within each reactor chamber 10 a nitrogen activator chamber 20 external to each reactor chamber 10.

The three apparatus whose schematic cross-sectional diagrams are illustrated by FIG. 1 to FIG. 3 differ principally in the method through which activated nitrogen is formed within the nitrogen activator chamber 20. Within FIG. 1, the activated nitrogen is formed within the nitrogen activator chamber 20 through a radio frequency plasma coupled with the nitrogen activator chamber 20. As illustrated in FIG. 1 a radio frequency generator 22 is coupled to form a radio frequency plasma within the nitrogen activator chamber 20. Within FIG. 2 there is illustrated an ultraviolet (UV) radiation source 24 as a means for forming activated nitrogen within the nitrogen flow through the nitrogen activator chamber 20 and nozzle 18. Finally, there is illustrated within FIG. 3 a microwave discharge source 26 coupled with the nitrogen activator chamber 20 as a means for forming activated nitrogen within the nitrogen flow through the nitrogen activator chamber 20 and the nozzle 18. Although not illustrated by the schematic cross-sectional diagrams of FIG. 1 and FIG. 3, plasmas other than radio frequency plasmas and microwave plasmas may be coupled to or formed within the nitrogen activator chamber 20 to form activated nitrogen within the nitrogen activator chamber 20. Such other plasmas may include, but are not limited to, electron cyclotron resonance (ECR) plasmas.

As is similarly understood by a person skilled in the art, methods and apparatus alternative to those illustrated in FIG. 1 to FIG. 3 may also be employed in forming a concentration of activated nitrogen within a nitrogen flow within a nitrogen activator chamber, such as the nitrogen activator chamber 20, and through through a nozzle, such as the nozzle 18, as illustrated in FIG. 1 to FIG. 3, provided that the method and/or apparatus is capable of providing activated nitrogen at a desired or requisite concentration level. Such alternative methods may include, but are not limited to, laser activation methods and electrical discharge activation methods.

The highly reactive character of activated nitrogen, as well as other characteristics of activated nitrogen, are disclosed in the inorganic materials arts. See, for example, Cotton et al., Advanced Inorganic Chemistry: A Comprehensive Text, Interscience Publishers (New York: 1972), pg. 346, wherein it is disclosed that within an electrical discharge under suitable conditions a very active form of nitrogen (ie: activated nitrogen) is formed from gaseous molecular nitrogen. Cotton also discloses that the activity of activated nitrogen is due to the presence of ground state (4S) nitrogen atoms which have a relatively long lifetime in a reactor chamber suitably passivated to limit recombination of activated nitrogen species. Finally, Cotton also discloses the presence of a persistent yellow afterglow of nitrogen flows having contained therein activated nitrogen. The yellow afterglow may provide a suitable means for monitoring and assuring the preferred or requisite concentrations of activated nitrogen within the the nitrogen activator chamber 20 and/or the reactor chamber 10 as employed within the preferred embodiment of the method of the present invention.

Figure 4:
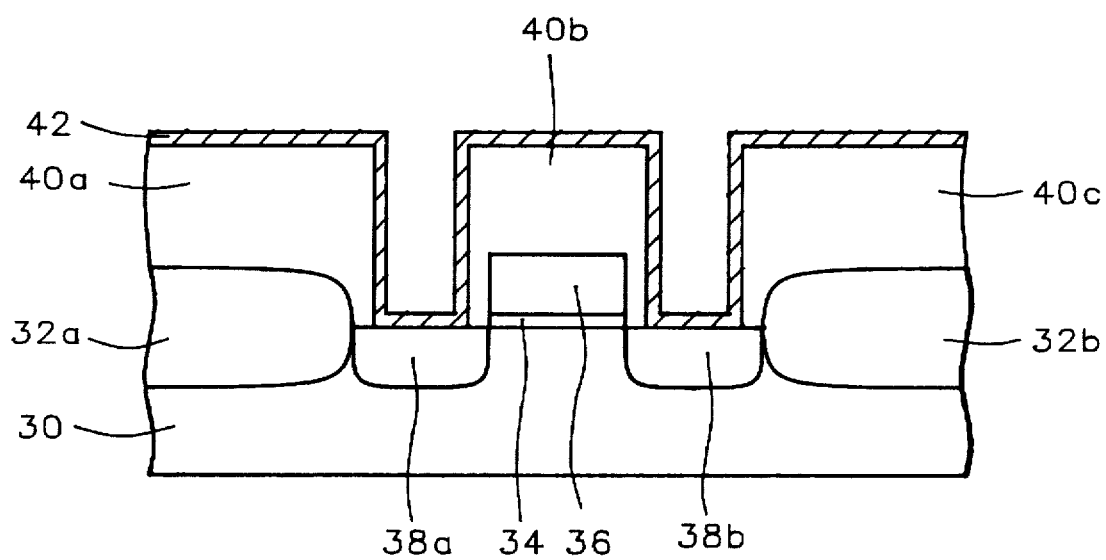
FIG. 4 to FIG. 7 show a series of schematic cross-sectional diagrams illustrating the results of progressive stages in forming within an integrated circuit a titanium nitride barrier layer in accord with the preferred embodiment of the method of the present invention.

Referring now to FIG. 4 to FIG. 7, there is shown a series of schematic cross-sectional diagrams illustrating the results of progressive stages in forming within an integrated circuit a titanium nitride layer in the position of a barrier layer, in accord with the preferred embodiment of the method of the present invention. Shown in FIG. 4 is a schematic cross-sectional diagram of the integrated circuit at an early stage in its fabrication.

Shown in FIG. 4 is a semiconductor substrate 30 having formed within and upon its surface a pair of isolation regions 32a and 32b which define an active region of the semiconductor substrate 30. Although semiconductor substrates are known in the art with either dopant polarity, several dopant concentrations and various crystallographic orientations, for the preferred embodiment of the method of the present invention, the semiconductor substrate 30 is preferably a (100) silicon semiconductor substrate having a N- or P- doping. Similarly, although it is also known in the art that isolation regions may be formed within and/or upon semiconductor substrates to define active regions of those semiconductor substrates through methods including but not limited to isolation region growth methods and isolation region deposition/patterning methods, for the preferred embodiment of the method of the present invention the isolation regions 32a and 32b are preferably formed within and upon the semiconductor substrate 30 through an isolation region thermal growth method to form isolation regions 32a and 32b of silicon oxide within and upon the semiconductor substrate 30.

Also shown in FIG. 4, within the active region of the semiconductor substrate 30, is a series of components which comprises a field effect transistor (FET). The series of components includes a gate dielectric layer 34, a gate electrode 36 and a pair of source/drain regions 38a and 38b. The series of components which comprises the field effect transistor (FET) may be formed though methods and materials as are conventional in the art of forming field effect transistors (FETs) within integrated circuits. Typically, the gate dielectric layer 34 is formed through patterning, through methods as are conventional in the art, of a blanket gate dielectric layer formed through thermal oxidation of the active region of the semiconductor substrate 30. Similarly, the gate electrode 36 is typically formed through patterning, through methods as are conventional in the art, of a blanket polysilicon or polycide gate electrode material layer formed upon the blanket gate oxide layer. Finally, the source/drain regions 38a and 38b are typically and preferably formed through implanting a dopant of suitable polarity into the active region of the semiconductor substrate 30, while employing the gate electrode 36 and the gate dielectric layer 34 as a mask.

There is also shown in FIG. 4 the presence of a series of patterned planarized pre-metal dielectric (PMD) layers 40a, 40b and 40c formed over the semiconductor substrate 30 including the components which comprise the field effect transistor (FET). The series of patterned planarized pre-metal dielectric (PMD) layers 40a, 40b and 40c may also be formed through methods and materials as are conventional in the art of integrated circuit fabrication. Preferably, the series of patterned planarized pre-metal dielectric (PMD) layers 40a, 40b and 40c is formed of a conformal silicon oxide dielectric material deposited through a plasma enhanced chemical vapor deposition (PECVD) method, planarized through a chemical mechanical polish planarizing method or reactive ion etch (RIE) etchback planarizing method and patterned through a plasma etch patterning method, as is conventional in the art. Other methods and materials may, however, be employed in forming the series of patterned planarized pre-metal dielectric (PMD) layers 40a, 40b and 40c . With regard to the apertures defined by the patterned planarized pre-metal dielectric layers 40a, 40b and 40c , the method of the present invention may be employed when the apertures defined by the patterned planarized pre-metal dielectric (PMD) layers 40a, 40b and 40b are of a width and aspect ratio conventional in the art of integrated circuit fabrication. Typically, the apertures defined by the patterned planarized pre-metal dielectric (PMD) layers 40a, 40b and 40c are from about 4000 to about 8000 angstroms in width and have an aspect ratio of from about 1:1 to about 6:1.

Finally, there is shown in FIG. 4 the presence of a nitride forming material layer 42, formed over the patterned planarized pre-metal dielectric (PMD) layers 40a, 40b and 40c and into the apertures defined by the patterned planarized pre-metal dielectric (PMD) layers 40a, 40b and 40c, thus contacting the source/drain regions 38a and 38b. For the preferred embodiment of the method of the present invention, the nitride forming material layer is preferably a titanium metal layer, although as discussed above other nitride forming materials, including but not limited to aluminum, silicon, hafnium, zirconium, vanadium, niobium and tantalum, may also be employed in forming a nitride forming material layer, such as the nitride forming material layer 42, within the method of the present invention. Although there are several methods through which may be formed within integrated circuits nitride forming material layers, such as titanium metal layers, including but not limited to thermally assisted evaporation methods, electron beam assisted evaporation methods, physical vapor deposition (PVD) sputtering methods and chemical vapor deposition (CVD) methods, for the preferred embodiment of the method of the present invention the nitride forming material layer 42 formed of a titanium metal layer is preferably formed through a physical vapor deposition (PVD) sputtering method, as is most common in the art. Preferably, the nitride forming material layer 42 formed of the titanium metal layer is preferably formed to a thickness of from about 200 to about 2000 angstroms.

Figure 5:
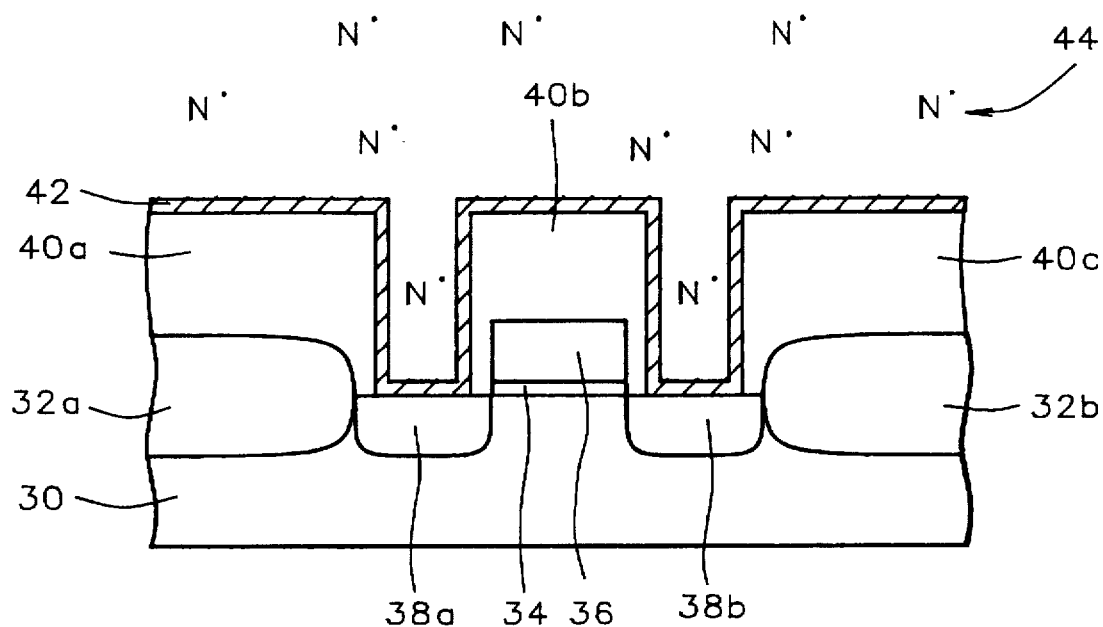

Referring now to FIG. 5, there is shown a schematic cross-sectional diagram illustrating the results of further processing of the integrated circuit whose schematic cross-sectional diagram is illustrated in FIG. 4. Shown in FIG. 5 is an atmosphere of activated nitrogen species 44 formed above the surface and within the apertures within the surface of the integrated circuit whose schematic cross-sectional diagram is illustrated in FIG. 4. The atmosphere of activated nitrogen species 44 is preferably formed within a nitrogen activator chamber and contained within a reactor chamber analogous the nitrogen activator chamber 22 and the reactor chamber 10 as illustrated in FIG. 1 to FIG. 3, although other reactor chambers and nitrogen activator chamber methods and apparatus may be employed within the method of the present invention.

For the preferred embodiment of the method of the present invention, the atmosphere of activated nitrogen species 44 surrounding the nitride forming material layer 42 is preferably present in a nitrogen carrier gas, although other inert carrier gases may also be employed within the method of the present invention. Preferably, the total pressure of the atmosphere of activated nitrogen species 44 and the nitrogen carrier gas is from about 10 to about 760 torr. Typically and preferably, the activated nitrogen species 44 are present at a minor concentration with respect to the nitrogen carrier gas, but at a sufficiently high concentration such that under appropriate thermal annealing conditions the activated nitrogen species 44 react efficiently with the nitride forming material layer 42. Notably, within the method of the present invention the pressure range under which activated nitrogen may be maintained within a nitrogen activator chamber, such as the nitrogen activator chamber 20, or a reactor chamber, such as the reactor chamber 10, is significantly higher than is typically employed in conventional plasma nitridation methods which require comparatively low pressures to maintain plasma discharges, thus allowing there to be employed within the method of the present invention an apparatus which is simpler than an apparatus employed within conventional plasma nitridation methods.

Figure 6:
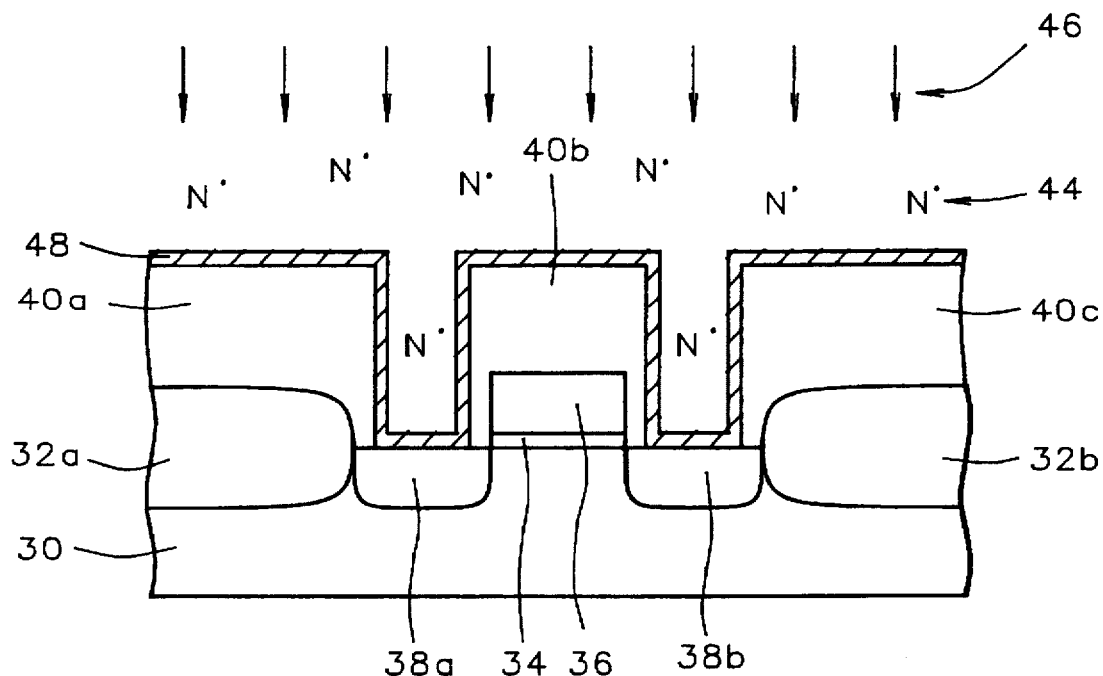

Referring now to FIG. 6, there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit otherwise equivalent to the schematic cross-sectional diagram of the integrated circuit whose schematic cross-sectional diagram is illustrated in FIG. 5, but with the addition of a thermal exposure 46 through which the nitride forming material layer 42 of FIG. 5 within the atmosphere of the activated nitrogen species 44 is reacted to form the nitride layer 48, preferably a nitride layer 48 formed of a titanium nitride material. For the preferred embodiment of the method of the present invention, the thermal exposure 46 which comprises in part the thermal annealing method of the present invention is preferably provided by the heat lamp 16 within the reactor chamber 10 as illustrated in FIG. 1 to FIG. 3, although other methods may alternatively be employed provided that they yield a preferred maximum semiconductor substrate 30 thermal annealing temperature of no less than about 900 degrees centigrade.

Upon completion of exposure of the semiconductor 30 to the thermal exposure 46, there is formed the nitride layer 48, preferably a nitride layer 48 of a titanium nitride material, without employing ammonia and without the need for excluding oxygen at all times when forming the nitride layer 48.

Figure 7:
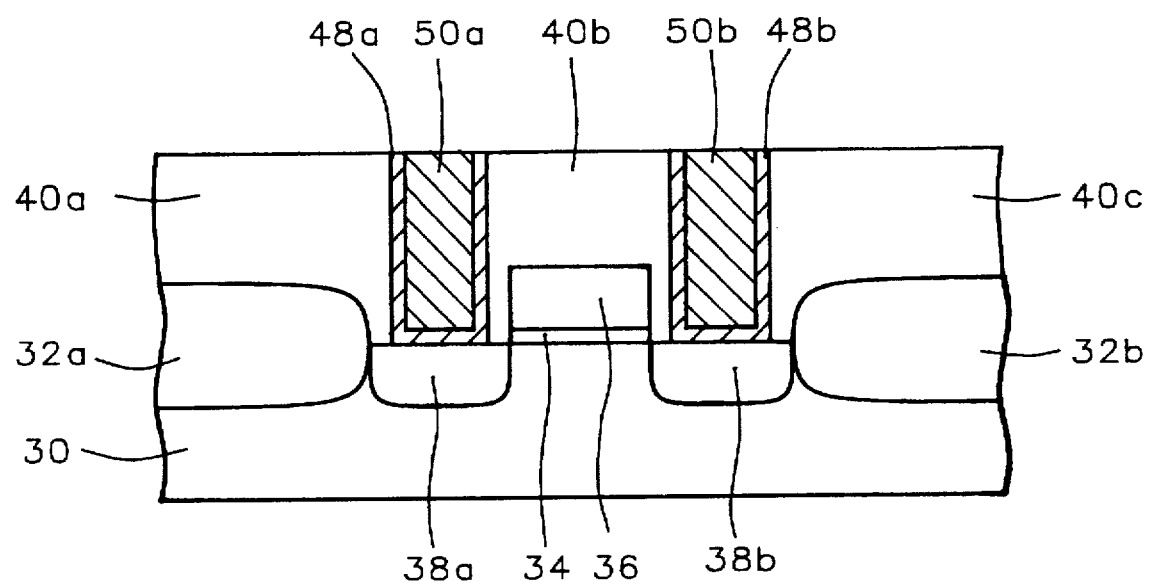

Referring now to FIG. 7, there is shown a schematic cross-sectional diagram illustrating the results of further processing of the integrated circuit whose schematic cross-sectional diagram is illustrated in FIG. 6. Shown in FIG. 7 is presence of a pair of conductive contact studs 50a and 50b formed upon a corresponding pair of patterned nitride layers 48a and 48b formed in turn into the apertures defined by the patterned planarized pre-metal dielectric (PMD) layers 40a, 40b and 40c. As is conventional in the art of integrated circuit fabrication, the pair of conductive contact studs 50a and 50b is preferably formed of tungsten metal, although other conductive materials, such as but not limited to metals, metal alloys and doped polysilicon, may also be employed in forming the pair of conductive contact studs 50a and 50b. In the process of forming the conductive contact studs 50a and 50b, the nitride layer 48, as illustrated in FIG. 6, is patterned to form the patterned nitride layers 48a and 48b while employing the patterned planarized pre-metal dielectric (PMD) layers 40a, 40b and 40c as etch stop layers. Within the preferred embodiment of the method of the present invention, patterned nitride layers 48a and 48b formed of patterned titanium nitride layers serve as adhesion promoter layers for the pair of conductive contact studs 50a and 50b. Were the conductive contact studs 50a and 50b alternatively formed of aluminum containing conductor metallization layers, the patterned nitride layers 48a and 48b formed of patterned titanium nitride layers would also serve as barrier layers to limit interdiffusion and spiking from the conductive contact studs 50a and 50b into the semiconductor substrate 30 at the locations of the source/drain regions 38a and 38b.

As is understood by a person skilled in the art, and although not specifically illustrated by the schematic cross-sectional diagrams of FIG. 4 to FIG. 7, the method of the present invention may also be employed in forming metal nitride layers as layers including but not limited to barrier layers and/or adhesion promoter layers beneath and/or above upper lying conductor layers and/or conductive interconnection stud layers further formed upon the integrated circuit whose schematic cross-sectional diagram is illustrated in FIG. 7. In accord with the preferred embodiment of the method of the present invention, such additional metal nitride layers will also typically and preferably be titanium nitride layers.

As is also understood by a person skilled in the art, the preferred embodiment of the method of the present invention is illustrative of the method of the present invention rather than limiting of the method of the present invention. Revisions and modifications may be made to methods, materials, structures, dimensions and apparatus through which is practiced the preferred embodiment of the method of the present invention while still providing an embodiment which is within the spirit and scope of the method of the present invention, as defined by the appended claims.

What is claimed is:

1. A thermal annealing method for forming a nitride layer within an integrated circuit comprising:

provide a substrate;

forming over the substrate a nitride forming material layer; and annealing through a thermal annealing method the nitride forming material layer in the presence of an atmosphere of activated nitrogen to yield a nitride layer, where the atmosphere of activated nitrogen is formed employing at least one of:

an electrical discharge within an atmosphere of nitrogen; and an ultra-violet exposure of the atmosphere of nitrogen.

2. The method of claim 1 wherein the nitride forming material layer is formed from a nitride forming material selected from the group of materials consisting of titanium, aluminum, silicon, hafnium, zirconium, vanadium, niobium and tantalum.

3. The method of claim 2 wherein the thickness of the nitride forming material layer is from about 10 to about 2000 angstroms.

4. The method of claim 1 wherein the atmosphere of activated nitrogen is formed through a plasma activation of the atmosphere of nitrogen.

5. The method of claim 1 wherein the thermal annealing method heats the substrate to a temperature of greater than about 900 degrees centigrade.

6. A thermal annealing method for forming a titanium nitride layer within an integrated circuit comprising:

providing a substrate;

forming over the substrate a titanium metal layer; and annealing through a thermal annealing method the titanium metal layer in the presence of an atmosphere of activated nitrogen to yield a titanium nitride layer, where the atmosphere of activated nitrogen is formed employing at least one of:

an electrical discharge within an atmosphere of nitrogen; and an ultra-violet exposure of the atmosphere of nitrogen.

7. The method of claim 6 wherein the thickness of the titanium metal layer is from about 200 to about 2000 angstroms.

8. The method of claim 6 wherein the atmosphere of activated nitrogen is formed through a plasma activation of the atmosphere of nitrogen.

9. The method of claim 6 wherein the thermal annealing method heats the substrate to a temperature of greater than about 900 degrees centigrade.

10. A thermal annealing method for forming a titanium nitride barrier layer within an integrated circuit comprising:

providing a semiconductor substrate having semiconductor devices formed thereupon;

forming over the semiconductor substrate a titanium metal layer; and annealing through a thermal annealing method the titanium metal layer in the presence of an atmosphere of activated nitrogen to yield a titanium nitride barrier layer, where the atmosphere of activated nitrogen is formed employing at least one of:

an electrical discharge within an atmosphere of nitrogen; and an ultra-violet exposure of the atmosphere of nitrogen.

11. The method of claim 10 wherein the thickness of the titanium metal layer is from about 200 to about 2000 angstroms.

12. The method of claim 10 wherein the atmosphere of activated nitrogen is formed in an atmosphere of nitrogen.

13. The method of claim 12 where the thermal annealing method heats the semiconductor substrate to a temperature of greater than about 900 degrees centigrade.

* * * * *